(12) United States Patent
Hu

(10) Patent No.: US 6,794,236 B1
(45) Date of Patent: Sep. 21, 2004

(54) EEPROM DEVICE WITH IMPROVED CAPACITIVE COUPLING AND FABRICATION PROCESS

(75) Inventor: YongZhong Hu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/160,855

(22) Filed: Jun. 3, 2002

(51) Int. Cl.[7] .......................................... H01L 21/8238
(52) U.S. Cl. ...................... 438/201; 438/211; 438/240; 438/257; 438/258; 438/260; 438/266
(58) Field of Search ................................ 257/314, 315, 257/316, 317, 318, 319, 320, 326; 438/201, 211, 240, 241, 257, 258, 260, 262, 266

(56) References Cited

U.S. PATENT DOCUMENTS

| | | | | |
|---|---|---|---|---|
| 5,053,839 A | * | 10/1991 | Esquivel et al. ............ | 257/317 |
| 5,057,446 A | | 10/1991 | Gill et al. | |
| 5,303,185 A | * | 4/1994 | Hazani ....................... | 257/314 |
| 5,371,704 A | * | 12/1994 | Okazawa ..................... | 365/185 |
| 5,751,631 A | * | 5/1998 | Liu et al. .................... | 257/316 |
| 5,900,656 A | * | 5/1999 | Park ............................. | 257/295 |
| 5,905,675 A | * | 5/1999 | Madurawe et al. ......... | 257/319 |
| 5,929,479 A | * | 7/1999 | Oyama ....................... | 257/315 |
| 6,153,463 A | * | 11/2000 | Wei et al. ................... | 438/253 |
| 6,255,169 B1 | | 7/2001 | Li et al. | |
| 6,307,775 B1 | * | 10/2001 | Forbes et al. ............... | 438/254 |
| 6,391,755 B2 | * | 5/2002 | Ma et al. ..................... | 438/593 |
| 6,399,457 B2 | * | 6/2002 | Park et al. ................... | 438/393 |

* cited by examiner

Primary Examiner—Eddie Lee
Assistant Examiner—Quang Vu
(74) Attorney, Agent, or Firm—Brinks Hofer Gilson & Lione

(57) ABSTRACT

An EEPROM device incorporates a partially encapsulated floating gate electrode in order to increase the capacitive coupling between the floating gate electrode and the control gate region of an EEPROM device. The floating gate electrode is partially encapsulated by a capacitor plate that is locally interconnected to the control gate region residing in a semiconductor substrate. The capacitor plate is electrically isolated from the floating gate electrode by a capacitor dielectric layer overlying the floating gate electrode. By partially encapsulating the floating gate electrode with a capacitor plate electrically connected to the control gate region, a high capacitance coupling is obtained between the floating gate electrode and the control gate region, while minimizing the substrate area necessary for fabrication of the capacitor portion of an EEPROM device.

14 Claims, 5 Drawing Sheets

EEPROM DEVICE WITH IMPROVED CAPACITIVE COUPLING AND FABRICATION PROCESS

CROSS REFERENCE TO RELATED APPLICATION

Related subject matter is disclosed in co-pending, commonly-assigned patent application titled "Compact Single-Poly Two-Transistor EEPROM Cell" having Ser. No. 09/643,279 and filed May 21, 2001.

TECHNICAL FIELD

The present invention relates, generally, to electrically-erasable-programmable-read-only-memory (EEPROM) devices and, more particularly, to improving the capacitive coupling within an EEPROM device.

BACKGROUND

Non-volatile memory devices are both electrically erasable and programmable. Such devices retain data even after the power to the device is terminated. One particular type of non-volatile memory device is the EEPROM device. In a flash EEPROM device, programming and erasing is accomplished by transferring electrons to and from a floating-gate electrode through a thin dielectric layer, known as a tunnel-oxide layer, located between the floating-gate electrode and the underlying substrate. Typically, the electron transfer is carried out either by hot electron injection, or by Fowler Nordheim tunneling. In either electron transfer mechanism, a voltage is coupled to the floating-gate electrode by a control-gate electrode that may be formed as a region in the substrate. The control-gate is capacitively coupled to the floating-gate electrode, such that a voltage applied to the control-gate electrode is coupled to the floating-gate electrode.

EEPROM cells are extensively used in programmable logic devices (PLDs). EEPROM cells used in PLDs can have a two transistor design or a three transistor design. A three transistor EEPROM cell, for example, includes a write transistor, a read transistor, and a sense transistor. In a two transistor device, the functions of read and sense transistors are combined into a single transistor. To program PLD EEPROMs, a high voltage $V_{pp}+$ is applied to the gate electrode of the write transistor and a relatively high voltage $V_{pp}$ is applied to the drain (bitline contact) of the write transistor. The voltage applied to the write transistor gate electrode turns the write transistor on allowing the voltage applied to the bitline to be transferred to the source of the write transistor. Electrons on the floating-gate electrode are drawn from the floating-gate electrode to the source of the write transistor, leaving the floating-gate electrode at a high positive potential. The application of such high voltage levels is a write condition that results in a net positive charge being stored in the EEPROM cell.

To erase the EEPROM cell, a voltage $V_{cc}$ is applied to the gate of the write transistor and ground potential is applied to the bitline and a high voltage $V_{pp}+$ is applied to the control-gate. Under this bias condition, the high voltage applied to array-control-gate is coupled to the floating-gate electrode and the EEPROM cell is erased by the transfer of electrons from the substrate to the floating-gate electrode.

Efficient programming of the EEPROM cell requires a large capacitive coupling between the floating gate electrode and the array-control-gate. Improved capacitive coupling also allows programming and erasing to be carried out at reduced voltages. Additionally, during the read cycle, improved reading currents can be achieved. The capacitive coupling is improved by increasing the capacitor area, which is typically accomplished by increasing the size of the floating gate electrode or substrate area of the array-control-gate, or both.

Although, simply increasing the area of the floating gate electrode or the array-control-gate improves capacitive coupling, the trend in PLD semiconductor fabrication is toward smaller, faster EEPROM cells that occupy little substrate area. Accordingly, a need exists for an EEPROM device and fabrication process to produce an EEPROM device having high capacitive coupling, while not requiring a corresponding increase in substrate area in which to build the device.

SUMMARY

The present invention is for an EEPROM device with improved capacitive coupling and a process for fabricating the device. In accordance with the invention, a single-gate layer EEPROM device is provided having a high coupling ratio between the floating gate electrode and a control gate electrode residing in a semiconductor substrate in close proximity to the floating gate electrode. By forming a capacitor plate that at least partially overlies the floating gate electrode, a large capacitive coupling is obtained between the control gate and the floating gate. By providing a high capacity coupling, the substrate area required for the control gate can be reduced enabling the overall size of the EEPROM device to also be reduced.

In accordance with the invention there is provided a single-gate layer EEPROM device that includes a control gate region in a semiconductor substrate and a floating gate electrode overlying at least a portion of the control gate region and separated from the control gate region by a first capacitor dielectric layer. A second capacitor dielectric layer overlies the floating gate electrode and a capacitor plate at least partially encapsulates the floating gate electrode. The capacitor plate is locally interconnected to the control gate region.

In another aspect, the invention includes a process for fabricating a single-gate layer EEPROM device that includes providing a semiconductor substrate having a floating gate electrode overlying a control gate region and separated from the control gate region by a first capacitor dielectric layer. A second capacitor dielectric layer is formed to overlie the floating gate electrode and a salicide process is carried out to form a capacitor plate that encapsulates at least a portion of a floating gate electrode and a local interconnect is formed to electrically couple the salicide capacitor plate to the control gate region in the semiconductor substrate.

Figure 1:
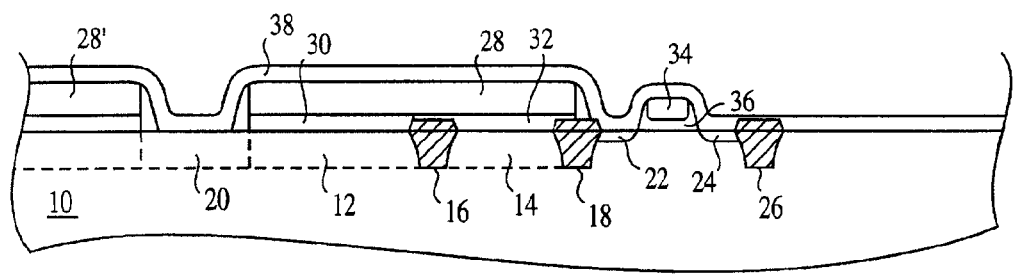
FIGS. 1–5 illustrate, in cross-section, process steps in accordance with the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

Illustrated in FIG. 1, in cross-section is a portion of a semiconductor substrate having already undergone several process steps in accordance with the invention. A semiconductor substrate 10 includes a control gate region 12 in semiconductor substrate 10 and electrically isolated from a program junction region 14 by isolation regions 16 and 18. As used herein, the term "program junction region" refers to a highly doped junction region in the substrate underlying the tunnel region and the control gate region. The program junction region is also known in the art by various terms, such as the tunneling implant region. A second program junction region 20 resides in control gate region 12 and is electrically isolated from program junction region 14 by isolation region 16. Semiconductor substrate 10 further includes source and drain regions 22 and 24, respectively. The source and drain regions reside in an active region (not shown) and are electrically isolated from control gate region 12 and from remaining portions of substrate 10 by isolation regions 18 and 26.

A floating gate electrode 28 overlies control gate region 12 and program junction region 14. Floating gate electrode 28 is separated from control gate region 12 by a first capacitor dielectric layer 30 and from program junction region 14 by a tunnel dielectric layer 32. A gate electrode 34 resides adjacent to floating gate electrode 28 and overlies a channel region located between source and drain regions 22 and 24. A gate dielectric layer 36 separates gate electrode 34 from semiconductor substrate 10.

Also illustrated in FIG. 1 is a portion of a floating gate electrode 28' that is associated with an adjacent EEPROM memory cell. Those skilled in the art will appreciate that, in a semiconductor device incorporating EEPROM memory cells, numerous memory cells are formed in close proximity to one another, such as in an embedded memory array within an integrated circuit device. For purposes of illustration, the device and process of the present invention will be described in the context of an N-type EEPROM memory cell. Those skilled in the art, however, will appreciate that the advantages of the present invention can be fully realized through the fabrication of a P-type device. Further, although semiconductor substrate 10 is illustrated as a single-crystal semiconductor substrate, other types of semiconductor substrates, such as epitaxial substrates, silicon-on-insulator substrates, and the like, can also be employed in the present invention.

Additionally, although the isolation regions illustrated in FIG. 1 are generally descriptive of trench isolation regions, other kinds of isolation regions can also be fabricated, such as those obtained by a localized-oxidation-of-silicon (LOCOS) process, and the like. Further, although floating gate electrodes 28 and 28' and gate electrode 34 are preferably fabricated by the deposition and anisotropic etching of polycrystalline silicon, other electrically conductive and semiconductive material, such as refractory metals, refractory metal silicides, and the like, and also be employed to form electrode structures.

In accordance with the invention, a second capacitor dielectric layer 38 is formed to overlie semiconductor substrate 10. Preferably, second capacitor dielectric layer 38 is a blanket-deposited dielectric layer that conformally overlies floating gate electrodes 28 and 28' and gate electrode 34. A second capacitor dielectric layer 38 can be fabricated from a wide variety of dielectric materials. The choice of a particular dielectric material is determined by device performance and reliability characteristics necessary for a specific application. In particular, second capacitor dielectric layer 38 can be fabricated from substantially the same material as first capacitor dielectric layer 30. Alternatively, different materials can be utilized for the fabrication of first and second capacitor dielectric layers 30 and 38.

In one embodiment, either one or both of first and second capacitor dielectric layers 30 and 38 can be a dielectric material, such as silicon oxide, oxynitride, a composite dielectric layer including silicon oxide and silicon nitride, and the like. Alternatively, either or both of first and second capacitor dielectric layer 30 and 38 can be a high dielectric constant material, such as a refractory metal oxide. For example, a suitable high dielectric constant metal oxide is tantalum oxide.

Figure 2:
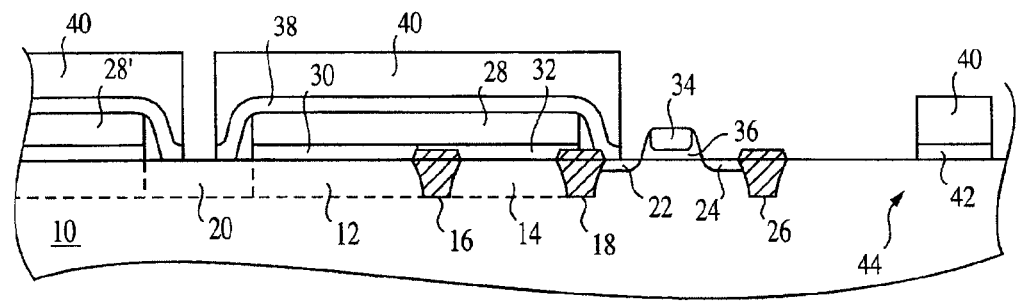

The inventive process continues, as illustrated in FIG. 2, with the formation of a lithographic pattern 40 and subsequent etching of second capacitor dielectric layer 38. Lithographic pattern 40 can be formed from a photolithographic material, such as photoresist, and the like, a deep-UV resist material, and X-ray resist material, and the like. Once lithographic pattern 40 is formed, an etching process is carried out to remove portions of second capacitor dielectric layer 38 exposed by lithographic pattern 40. Depending on the particular features size of the EEPROM device being fabricated, the etching process can be isotropic or anisotropic. Once complete, the etching process leaves a portion of second capacitor dielectric layer 38 overlying floating gate electrodes 28 and 28', and also leaves a portion 42 overlying a peripheral block region 44 of semiconductor substrate 10.

Figure 3:
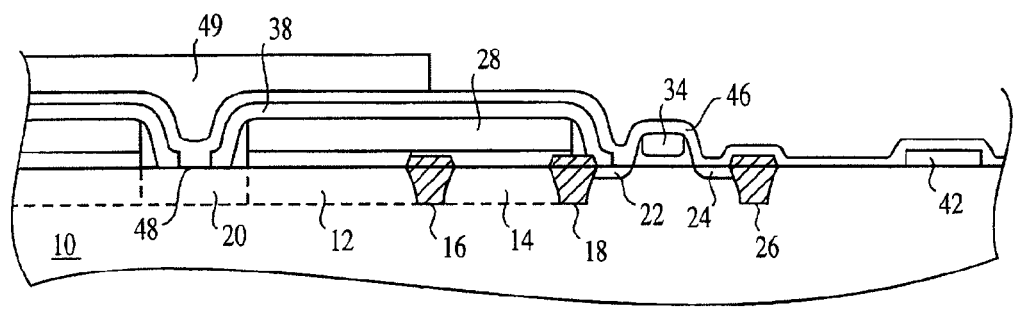

After second capacitor dielectric layer 38 has been patterned, a silicon layer 46 is deposited to overlie semiconductor substrate 10, as illustrated in FIG. 3. Silicon layer 46 is preferably conformally deposited by a chemical-vapor-deposition (CVD) process to overlie floating gate electrodes 28 and 28', gate electrode 34, and capacitor dielectric portion 42. In accordance with the invention, silicon layer 46 can be any of a number of different kinds of silicon, including polycrystalline silicon, amorphous silicon, and the like. During the patterning of second capacitor dielectric layer 38, the etching process exposed a surface contact region 48 of semiconductor substrate 10. The formation of silicon layer 46 is carried out, such that silicon layer 46 intimately contacts second program junction region 20 in semiconductor substrate 10 at surface contact region 48.

After forming silicon layer 46, a lithographic pattern 49 is formed to overlie a portion of silicon layer 46. Lithographic pattern 49 can be formed of a resist material similar to that used to form lithographic pattern 40.

Figure 4:
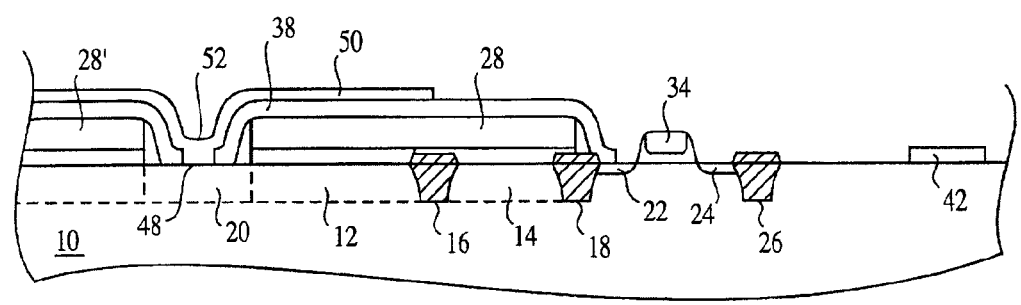

Once lithographic pattern 49 is formed, an etching process is carried out to form capacitor plate 50 and lithographic pattern 48 is removed. As illustrated in FIG. 4, capacitor plate 50 overlies a portion of floating gate electrode 28 and is electrically connected to control gate region 12 through second program junction region 20 and a local interconnect 52. As further illustrated in FIG. 4, capacitor plate 50 also overlies a portion of adjacent floating gate electrode 28'. Capacitor plate 50 is electrically isolated from floating gate electrode 28 by second capacitor dielectric layer 38.

Those skilled in the art will appreciate that a wide variety of techniques exist for fabricating an interconnect structure in which to electrically connect capacitor plate 50 and second program junction region 20. For example, a metal interconnect and contact structure can also be formed to electrically connect capacitor plate 50 to second program junction region 20. As will subsequently by described, a metal interconnect structure requires an additional conductive layer and contact openings to expose portions of the structures to be interconnected.

Next, in accordance with one embodiment of the invention, a salicide process is carried out to form a refractory metal salicide in at least surface portions of capacitor plate 50, gate electrode 34, source and drain regions 22 and 24, and surface portions of semiconductor substrate 10 on either side of second capacitor dielectric portion 42. Preferably, the salicide process substantially converts local interconnect 52 into a suicide material.

To carry out the salicide process, a thin layer of a refractory metal, such as titanium, cobalt, nickel, and the like, is deposited to overlie the surface of substrate 10. Then, a thermal process is carried out to react the refractory metal with any silicon in direct contact with the refractory metal. The thermally induced reaction forms a refractory metal salicide as all locations where the refractory metal comes into direct contact with a silicon surface. The thermal process can be one of a number of different thermal processes, such as conventional conductive heating, rapid thermal annealing, and the like. Additionally, the thermal processing can be carried out in stages, in which a first thermal annealing process is performed, followed by a brief etching process to remove unreacted portions of the refractory metal overlying dielectric surfaces, followed by a second thermal annealing step to complete the reaction to form a low-resistance refractory metal salicide. Those skilled in the art will appreciate that numerous variations for the formation of a refractory metal salicide are possible. For example, various surface treatment processes can be carried out prior to depositing a refractory metal layer.

Figure 5:
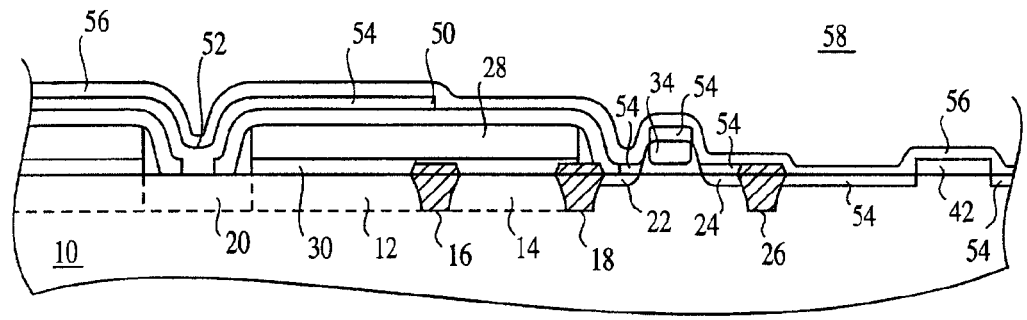

Upon completion of the salicide process, refractory metal silicide regions 54 are formed as illustrated in FIG. 5. A dielectric liner 56 is deposited to overlie the surface of substrate 10. Then, an inter-level-dielectric (ILD) layer 58 is formed to overlie dielectric liner 56. Dielectric liner 56 and ILD layer 58 can be formed from any of a number of dielectric materials, such as silicon oxide, doped silicon oxide, silicon nitride, and the like. Further, ILD layer 58 can be formed by a CVD, or formed by a plasma-enhanced-CVD (PECVD) process, or the like. Thus, the major operating components of the EEPROM device components are electrically insulated by dielectric liner 56 and ILD layer 58. In the illustrated embodiment, silicided capacitor plate 50 encapsulates at least a portion of floating gates 28 and 28'. Also, capacitor plate 50 is directly electrically connected to control gate 12 and second program junction region 20 at local interconnect 52.

Figure 6A:
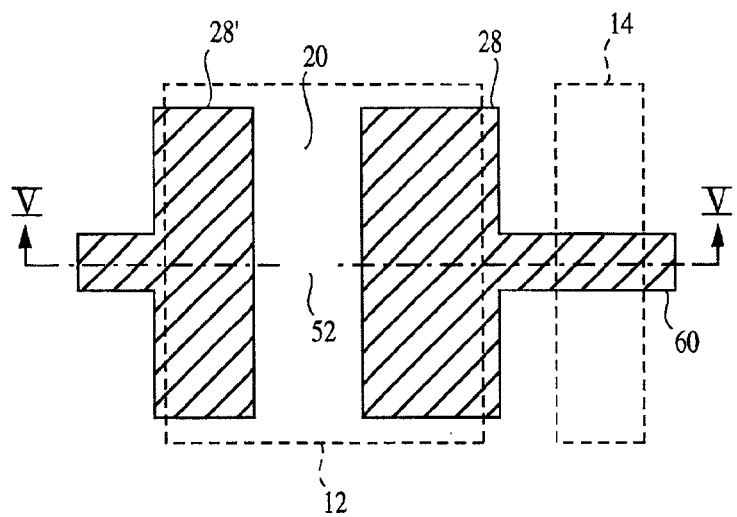
FIGS. 6A and 6B are partial composite views of alternative embodiments of the device illustrate in FIG. 5.

FIG. 6A illustrates a partial composite view of the device structure illustrated in FIG. 5 in accordance with a local interconnect embodiment of the invention. Floating gate electrodes 28 and 28' overlie portions of control gate region 12. An elongated portion 60 of control gate electrode 28 extends over program junction region 14. Those skilled in the art will appreciate that the partial composite view of FIG. 6A illustrates portions of two adjacent EEPROM memory cells sharing a common control gate region 12. In semiconductor devices containing embedded EEPROM memory arrays and in EEPROM device components, numerous memory cells are formed and electrically coupled in order to store large quantities of information.

As illustrated in FIG. 6A, floating gate electrodes 28 and 28' and control gate region 12 can potentially occupy a large portion of an EEPROM memory cell. Indeed, in order to obtain a high degree of capacity coupling necessary for efficient cell operation, the substrate area required to create a high capacity coupling between floating gate electrode 28 and control gate region 12 typically can occupy a substantial portion of any EEPROM memory cell. In accordance with the invention, a partially encapsulated floating gate electrode is created by forming capacitor plate 50, such that it partially encapsulates floating gate electrode 28. By effectively increasing the area for a capacitive coupling through a partially overlying capacitor plate, the overall area needed to fabricate control gate region 12 and floating gate electrode 28 can be reduced. This reduction in substrate surface area directly translates into an increased packing density of EEPROM memory cells.

Figure 6B:
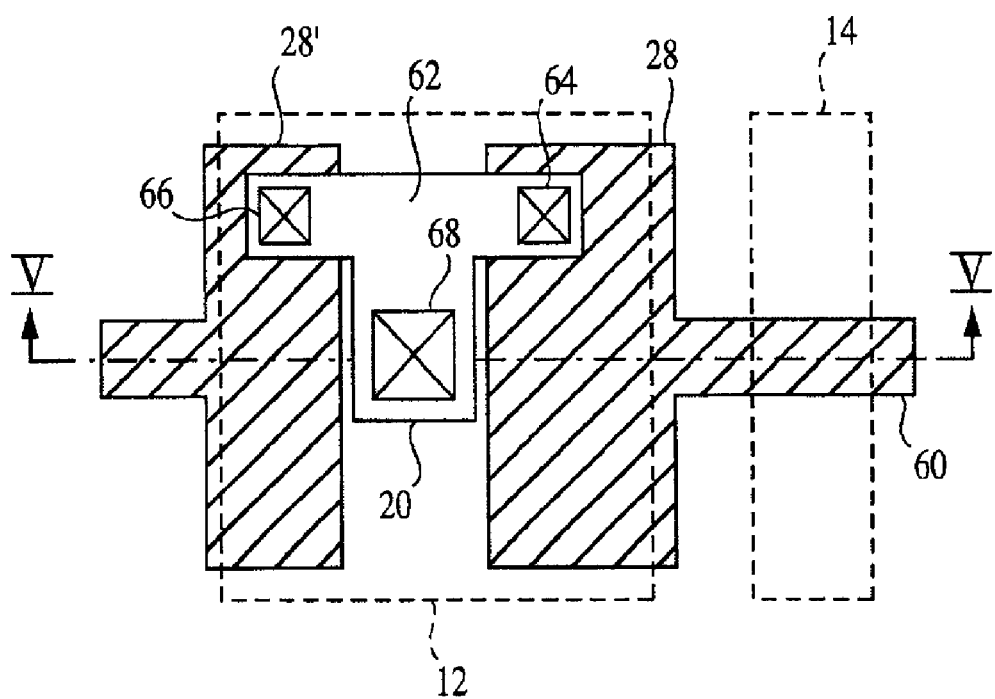

FIG. 6B illustrates a partial composite view of the device structure illustrated in FIG. 5 in accordance with a metallized interconnect embodiment of the invention. An electrically conductive layer 62 overlies a portion of capacitor plates 28 and 28' and is electrically connected to the capacitor plates through contacts 64 and 66. Electrically conductive layer 62 is also electrically connected to second program junction region 20 through a contact 68.

Figure 7A:
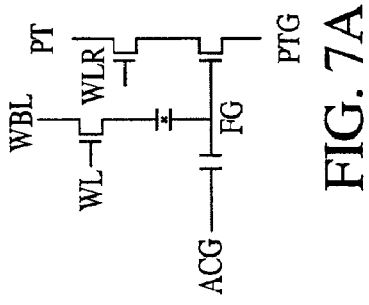
FIGS. 7A and 7B illustrate schematic circuit diagrams of 3-transistor EEPROM devices arranged in accordance with the invention.
Figure 7B:
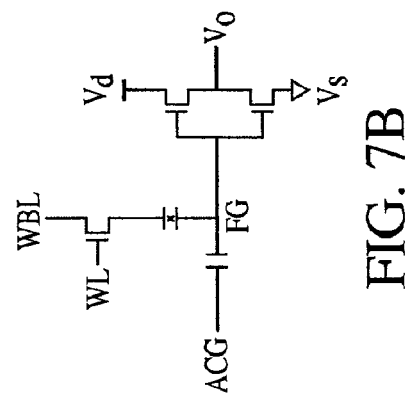

Importantly, the EEPROM memory device and fabrication process of the invention can be advantageously employed in a wide variety of EEPROM memory cell architectures. Schematic circuit diagram of two exemplary three-transistor EEPROM memory cells are illustrated in FIGS. 7A and 7B. For reference purposes, control gate region 12 is depicted by the symbol "ACG" and floating gate electrode 28 is depicted by the symbol "FG" in FIGS. 7A and 7B. Further, the symbols "WL" represent a word line, "WBL" represent a write bit line, "WLR" represents a read word line, "PT" represent a product term, "PTG" represent a product term ground, "$V_d$" and "$V_s$" are supply voltages, and "$V_0$" is an output node voltage. Those skilled in the art will recognize the schematic circuit diagrams of FIGS. 7A and B to illustrate two common configurations for a three-transistor EEPROM memory device.

Figure 8A:
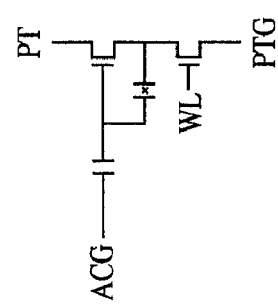
FIGS. 8A and 8B illustrate schematic circuit diagrams of 2-transistor EEPROM devices arranged in accordance with the invention.
Figure 8B:
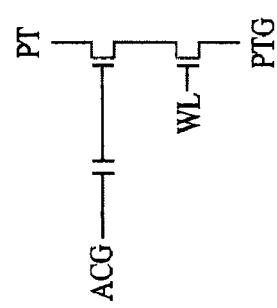

In accordance with yet another implementation of the EEPROM memory device and process of the present invention, exemplary schematic circuit diagrams of two-transistor EEPROM memory cells are illustrated in FIGS. 8A and 8B. The components identified by symbols are the same elements as described above. The position of control gate region 12 and floating gate electrode 28 relative to other circuit components is also illustrated.

Thus, it is apparent that there has been described, in accordance with the invention, an EEPROM device with improved capacitive coupling and fabrication process that fully meets the advantages set forth above. Although the invention has been described and illustrated of reference to specific illustrative embodiments thereof, it is not intended that the invention be limited to those illustrative embodiments. Those skilled in the art will recognize that variations and modifications can be made without departing of the spirit of the invention. For example, numerous architectural variations exist for the fabrication of a single-gate layer EEPROM device. Further, many different process techniques can be used to fabricate the EEPROM device. For example, molecular ion beam processes, electron, cyclotron, resins etching processes and the like can be used. It is therefore intended to include within the invention all such variations and modifications as fall within the scope of the appended claims and equivalents thereof.

What is claimed is:

1. A process for fabricating an EEPROM device comprising:

forming a control gate region in a semiconductor substrate;

forming a floating gate electrode overlying at least a portion of the control gate region and separated therefrom by a first capacitor dielectric layer;

forming a second capacitor dielectric layer overlying the floating gate electrode; and forming a capacitor plate layer that at least partially overlies the floating gate electrode and is electrically connected to the control gate region through an opening in the second capacitor dielectric layer.

2. The process of claim 1, wherein forming a second capacitor dielectric layer comprises forming a layer of material substantially similar to the first capacitor dielectric layer.

3. The process of claim 2, wherein forming a second capacitor dielectric layer comprises forming a layer selected from the group consisting of silicon oxide, silicon nitride, and combinations thereof.

4. The process of claim 1, wherein forming a second capacitor dielectric layer comprises forming a high dielectric constant layer.

5. The process of claim 4, wherein forming a high dielectric constant layer comprises forming a refractory metal oxide layer.

6. The process of claim 1, wherein forming a capacitor plate layer electrically connected to the control gate region comprises forming a local interconnect structure comprising an electrical connection to a program junction region residing in the substrate adjacent to the control gate region.

7. The process of claim 1, wherein forming a capacitor plate layer comprises forming a salicide layer.

8. The process of claim 7, wherein forming a salicide layer comprises:

forming a silicon layer overlying the second capacitor dielectric layer;

patterning the silicon layer to define the capacitor plate; and depositing a refractory metal and applying thermal energy to form a salicide material.

9. The process of claim 1, wherein forming a capacitor plate layer electrically connected to the array control gate region comprises forming a local interconnect.

10. The process of claim 1, wherein forming a capacitor plate layer electrically connected to the array control gate region comprises forming an opening in the second capacitor dielectric layer and forming a metallized contact structure in the opening.

11. A process for fabricating a single-gate layer EEPROM device comprising:

providing a semiconductor substrate having a floating gate electrode overlying a control gate region and separated therefrom by a first capacitor dielectric layer;

forming a second capacitor dielectric layer overlying the floating gate electrode; and forming a salicide capacitor plate that overlies at least a portion of the floating gate electrode and that is locally interconnected to the control gate region, wherein forming a salicide capacitor plate comprises:

forming an opening in the second capacitor dielectric layer to expose a contact surface of the array control gate region;

forming a patterned silicon layer overlying at least a portion of the floating gate electrode and the contact surface of the array control gate region;

depositing a refractory metal layer overlying the patterned silicon layer; and applying thermal energy to form a salicide material in the patterned silicon layer and in the contact surface.

12. The process of claim 11 further comprising forming a program junction region in the substrate below the contact surface that electrically connects the array control gate region to the salicide capacitor plate.

13. A process for fabricating an EEPROM device comprising:

providing a substrate;

forming a first memory cell and a second memory cell, wherein each memory cell includes a floating gate electrode overlying a control gate region in the substrate and separated therefrom by a dielectric layer;

forming a capacitor dielectric layer overlying the floating gate electrode of each memory cell;

forming an opening in the capacitor dielectric layer exposing a portion of the substrate intermediate to the first and second memory cells; and forming a capacitor plate layer overlying at least a portion of floating gate electrode of each memory cell, wherein the capacitor plate layer contacts the substrate through the opening in the capacitor dielectric layer.

14. The process of claim 13, wherein forming a capacitor plate comprises:

forming a patterned silicon layer overlying at least a portion of the floating gate electrode of each memory cell and the portion of the substrate;

depositing a refractory metal layer overlying the patterned silicon layer; and applying thermal energy to form a salicide material in the patterned silicon layer and in the contact surface.

* * * * *